United States Patent [19]

Joder et al.

[11] Patent Number: 4,881,027
[45] Date of Patent: Nov. 14, 1989

[54] CIRCUIT ARRANGEMENT COMPRISING INPUT CIRCUITS TO FIND A POWER OUTPUT SUM FOR APPLICATION IN MULTI-PHASE ELECTRICITY METERS

[75] Inventors: Andreas Joder, Unterägeri; Franz Renggli, Buchrain, both of Switzerland

[73] Assignee: LGZ Landis & Gyr Zug AG, Zug, Switzerland

[21] Appl. No.: 225,526

[22] Filed: Jul. 28, 1988

[30] Foreign Application Priority Data

Aug. 6, 1987 [CH] Switzerland .................. 03030/87

[51] Int. Cl.⁴ .................. G01R 11/16; G01R 21/06
[52] U.S. Cl. .................. 324/107; 324/142; 324/140 R
[58] Field of Search .................. 324/140 R, 142, 107, 324/141; 364/483; 340/637

[56] References Cited

U.S. PATENT DOCUMENTS

| 4,079,313 | 3/1978 | Callan | 324/142 |
| 4,454,471 | 6/1984 | Schwentner et al. | 324/107 X |
| 4,525,668 | 6/1985 | Lienhard et al. | 324/142 X |

FOREIGN PATENT DOCUMENTS 2951627 2/1981 Fed. Rep. of Germany .
3115522 4/1982 Fed. Rep. of Germany .

Primary Examiner—Reinhard J. Eisenzopf
Assistant Examiner—Vinh P. Nguyen
Attorney, Agent, or Firm—Marmorek Guttman & Rubenstein

[57] ABSTRACT

A circuit arrangement for summing power outputs is disclosed. The circuit arrangement is especially useful in connection with a multi-phase electricity meter. The arrangement includes a plurality of input circuits connected in sequence, each of which has a current-to-voltage converter and a multiplier connected to the current-to-voltage converter. A voltage-to-frequency converter is connected at the output of each multiplier. Starting, at least with the second input circuit in the sequence, an adder is connected to the voltage-to-frequency converter by means of two inputs of the adder. Two other inputs of the adder are connected to two outputs of the preceding input circuit in the sequence. Illustratively, two outputs of each adder form two outputs of the corresponding input circuit. A ternary encoder followed by a ternary decoder may be located between the outputs of one input circuit and the adder of the succeeding input circuit. The two outputs of the adder in the last input circuit in the sequence are connected to the inputs of a forwards/backwards counter. Each of the two outputs of the forwards/backwards counter is connected to a mechanism such as a stepping motor which activates a display.

3 Claims, 3 Drawing Sheets

PA 2389

CIRCUIT ARRANGEMENT COMPRISING INPUT CIRCUITS TO FIND A POWER OUTPUT SUM FOR APPLICATION IN MULTI-PHASE ELECTRICITY METERS

FIELD OF THE INVENTION

The present invention relates to a circuit arrangement for finding a power output sum, which arrangement is particularly suited for use in multi-phase electricity meters.

BACKGROUND OF THE INVENTION

Such circuit arrangements are preferably used in multi-phase meters to measure the sum of electrical power outputs of all phases or in summing meters to measure the sum of any power outputs. The power outputs may be active power outputs, wattless power outputs or apparent power outputs in this instance. In electricity meters this sum is subsequently integrated over a period of time in order to find the corresponding energy value which is then displayed.

A configuration of the type mentioned above is known from DE No. 31 15 5222.

It is an object of the present invention to create a circuit arrangement of the type mentioned above which is simple in construction and which makes it possible to utilize single current systems, in particular single phase systems and to connect these together in a simple manner in order to find the power output sums.

SUMMARY OF THE INVENTION

The present invention is a circuit arrangement for summing power outputs. The circuit arrangement of the present invention is especially useful in connection with a multi-phase electricity meter.

The arrangement of the present invention comprises a plurality of input circuits connected in sequence, each of which comprises a current-to-voltage converter and a multiplier connected to the current-to-voltage converter. A voltage-to-frequency converter is connected at the output of each multiplier.

Starting, at least with the second input circuit in the sequence, an adder is connected to the voltage-to-frequency converter by means of two inputs of the adder. Two other inputs of the adder are connected to two outputs of the preceding input circuit in the sequence. Illustratively, two outputs of each adder form two outputs of the corresponding input circuit. A ternary encoder followed by a ternary decoder may be located between the outputs of one input circuit and the adder of the succeeding input circuit.

The two outputs of the adder in the last input circuit in the sequence are connected to the inputs of a forwards/backwards counter. Each of the two outputs of the forwards/backwards counter is connected to a mechanism such as a stepping motor which activates a display.

BRIEF DESCRIPTION OF THE DRAWING

Identical reference numbers indicate identical elements in all figures of the drawing.

DETAILED DESCRIPTION OF THE INVENTION

Figure 1:
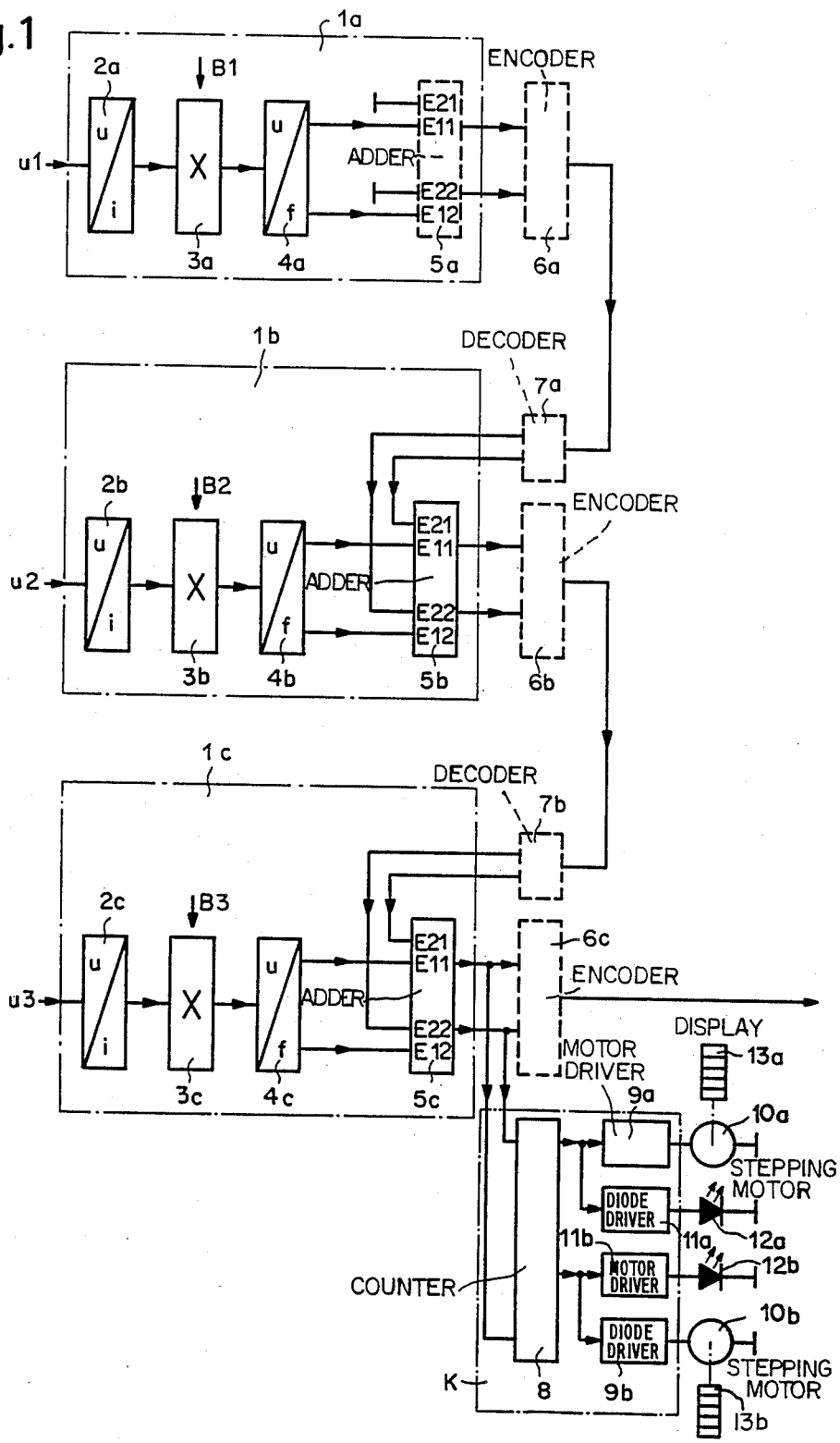
FIG. 1 shows a block diagram of a circuit arrangement according to the invention to find the sum of three power outputs or of three, energies.

The circuit arrangement according to the present invention is provided with at least two input circuits. In the circuit arrangement shown in FIG. 1, it is assumed that three input circuits 1a, 1b and 1c are present. The input circuits are connected in sequence. Each input circuit 1a, 1b and 1c contains an input converter 2a, 2b or 2c which is followed by a multiplier 3a, 3b or 3c. In every input circuit 1a, 1b and 1c each multiplier 3a, 3b or 3c is followed by a voltage/frequency converter 4a, 4b or 4c in series.

The input converters 2a, 2b and 2c can be known voltage/current converters for example, having one of the three phase voltages u1, u2 or u3 as their input signal. The voltage/current converters 2a, 2b and 2c convert their input signal into a proportional current which feeds the multipliers 3a, 3b or 3c. These multipliers 3a, 3b and 3c are preferably Hall elements. The currents corresponding to the phase voltages u1, u2 and u3 produce the proportional magnetic inductions B1, B2 and B3 which are applied to the corresponding Hall elements. At the output of each multiplier 3a, 3b and 3c a Hall voltage is thus present and is proportional to the product uk x Bk and therefore proportional to the corresponding power output Pk, where k=1, 2 or 3. The voltage/frequency converters 4a, 4b and 4c transform the output voltage of each of the multipliers 3a, 3b and 3c, and thereby each of the corresponding power outputs Pk, into a proportional frequency.

Each voltage/frequency converter 4a, 4b or 4c is followed in the input circuit 1a, 1b or 1c by an adder 5a, 5b or 5c in a series connection with the help of a first input E11 or E12 of the applicable adder 5a, 5b or 5c. Each output of the adder 5a, 5b and 5c in turn constitutes an output of the corresponding input circuit 1a, 1b or 1c. The second input E21 or E22 of each adder 5a, 5b and 5c is connected to the output of the preceding input circuit 1a or 1b, respectively, of the sequence, either directly or via additional elements.

In the first input circuit 1a of the sequence the corresponding adder 5a is however optional and is therefore shown by a broken line. An adder is thus installed after every voltage/frequency converter 4b or 4c in series connection, starting at least at the second input circuit 1b of the sequence. If an adder 5a is present in the first input circuit 1a of the sequence according to the following assumption, its second input or all its second inputs are grounded (see FIG. 1).

Since the power outputs Pk can be positive as well as negative, each voltage/frequency converter 4a, 4b and 4c is provided with two outputs as a rule, one for the positive and one for the negative power output Pk. Such voltage/frequency converters are often used in single phase meters and are therefore known as such. They are not object of the instant invention and are therefore not described in greater detail. For a better understanding it should only be noted that each of the voltage/frequency converters 4a, 4b and 4c contains a switch which guides the output pulses of the voltage/frequency converter 4a, 4b and 4c to one output when the power output Pk is positive, and to another output when the power output Pk is negative.

In case that the voltage/frequency converters 4a, 4b and 4c have two outputs (see FIG. 1), each of the adders 5a, 5b and 5c is provided with two first inputs E11 and E12 as well with two second inputs E21 and E22. The input pair E11 and E21 correspond to the positive power output, for example, and the input pair E12 and E22 to the negative power output.

Each of the two outputs of the voltage/frequency converters 4a, 4b and 4c is connected to one of the first inputs E11 or E12 of its corresponding adder 5a, 5b or 5c. Each adder 5a, 5b and 5c, and thereby also each input circuit 1a, 1b and 1c is also provided with two outputs, one for the pulses of the positive, and one for the pulses of the negative, power output Pk. The second inputs E21 and E22 of each adder 5a, 5b and 5c are then connected to that output of the preceding input circuit 1a or 1b of the sequence which corresponds to a positive or negative power output of same nature.

Because of the miniaturization of the input circuits 1a, 1b and 1c it is often very difficult to provide them with two output connections. In that case each of the two outputs of the input circuits 1a and 1b is connected preferably via a ternary (i.e. three state) encoder 6a or 6b and a downstream ternary decoder 7a or 7b to the second inputs E21 and E22 of the adders 5b and 5c. The ternary encoder transforms the corresponding pulses of the positive power output into positive pulses and those of the negative power output into negative pulses so that although three voltage levels −VSS, 0 Volt and +VDD are present at the output of each ternary encoder 6a and 6b, this output has nevertheless only one pole, as this provides for space-saving connections. The connection to the ternary decoder 7a or 7b is then effected via a single wire. The ternary decoder 7a or 7b, which is partially installed in proximity to the following input circuit of the sequence and which can for instance be integrated with this input circuit, then transforms the ternary pulses back into normal binary pulses which appear at one of the two outputs of the ternary encoder 7a or 7b, depending upon the existing positive or negative power output. These two outputs are then connected to the second inputs E21 and E22 of the following adder 5b or 5c.

The two outputs of the adder 5c of the last input circuit 1c in the sequence can optionally also be connected to the inputs of an additional ternary encoder 6c, for instance for purpose of tele-transmission. In that case the output of the ternary encoder 6c constitutes a time-serial output of the configuration at which the ternary pulses occur.

The two outputs of the adder 5c of the last input circuit 1c of the sequence are connected to the forwards-counter input and to the backwards-counter input of a forwards/backwards counter 8 which has two outputs. The forwards/backwards counter 8 is also a frequency divider. The frequency of the binary pulses which occur at one of its outputs is equal to a positive power output sum and that which occurs at another output is equal to a negative power output sum. The first output of the forwards/backwards counter 8 is connected via a first motor driver 9a to a first feeder pole of a first stepping motor 10a and/or via a first diode driver 11a to the anode of an illuminated diode 12a. The second output of the forwards/backwards counter 8 on the other hand, is connected via a second motor driver 9b to a first feeder pole of a second stepping motor 10b and/or via a second diode driver 11b to the anode of a second illuminated diode 12b. The second feeder pole of the stepping motors 10a and 10b as well as the cathode of the illuminated diodes 12a and 12b are all grounded. Each of the two stepping motors 10a and 10b activates a mechanical display 13a or 13b.

Instead of the assembly groups 9a; 10a; 13a and 9b; 10b; 13b, purely electronic assembly groups can also be used, each of which may for example contain one segment display comprising illuminated diodes or liquid crystals. The forwards/backwards counter 8 is then preferably built up from non-volatile memories so that its information content cannot be lost in case of a power failure.

A block K, consisting of the assembly group 8; 9a; 9b; 11a; 11b as well as the blocks 6a, 6b, 6c, 7a and 7b can for example be designed as integrated circuits and can be components of each of the input circuits 1a, 1b and 1c. This is an especially economic solution when the input circuit 1a, 1b and 1c is to be built up as an integrated circuit. In that case the blocks K of the input circuit 1a and 1b are idling and their outputs are not connected to anything. Only the outputs of block K of the last input circuit 1c is then loaded with the stepping motors 10a and 10b as well as with the illuminated diodes 12a and 12b.

The wiring of the adders 5a, 5b and 5c is electrically identical to a series connection of the adders. By means of this connection those output pulses of the voltage/frequency converters 4a, 4b and 4c which correspond to a positive power output Pk are combined so that binary pulses with a frequency that is proportional to the sum of all positive power outputs Pk occur at one of the two outputs of the last adder 5c. On the other hand, this series connection also causes those output pulses of the voltage/frequency converters 4a, 4b and 4c which correspond to a negative power output Pk to be combined so that binary pulses with a frequency that is proportional to the sum of all negative power outputs Pk occur at the other one of the two outputs of the last adder 5c.

The forwards/backwards counter 8 forward-counts the output pulses of the adder 5c which correspond to a positive power output and backward-counts the output pulses of the adder 5c which correspond to a negative power output. Its count value corresponds to the algebraic sum of both types of power outputs. If this algebraic sum is positive, its output pulses are counted by the stepping motor 10a for example, and are displayed by means of display 13a. If the algebraic sum is negative on the other hand, its output pulses are counted by the stepping motor 10b and are displayed by means of display 13b.

The motor drivers 9a and 9b as well as the two diode drivers 11a and 11b are basically known circuits and are only used to adapt the voltage as well as the current of their input pulses to the requirements of the stepping motors 10a and 10b or of the illuminated diodes 12a and 12b.

Each of the illuminated diodes 12a and 12b (one for the positive and one for the negative sum of the power outputs) which blink in time with the output frequency of the forward/backward counter 8 represents a time-serial output of the arrangement which makes it possible to measure these output frequencies and thereby also the positive and negative sum of the power outputs by means of an external optical device (not shown).

It is obvious that if only one type of positive or negative energy is present and is to be measured, one of the two assembly groups 9a: 10a; 11a: 12a; 13a or 9b; 10b: 11b; 12b: 13b is superfluous and may be omitted.

Figure 2:
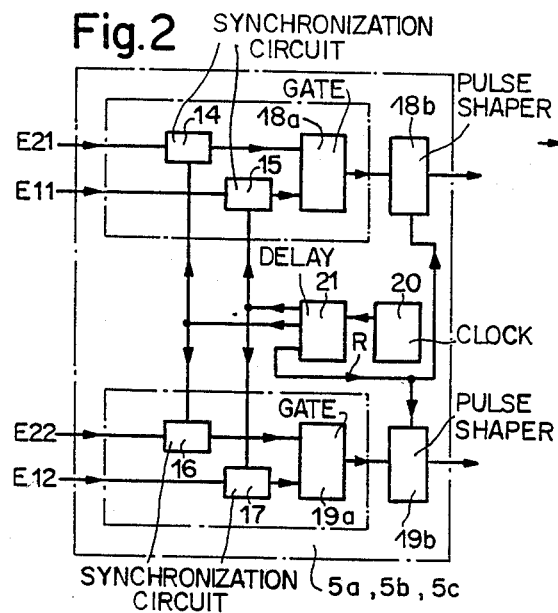
FIG. 2 shows a block diagram of an adder of positive and negative power outputs.

All the adders 5a, 5b and 5c are of identical structure, e.g. such as shown in FIG. 2. Each adder 5a, 5b and 5c comprises, in this case, four synchronization circuits 14, 15, 16 and 17, a first gate 18a, a second gate 19a, a clock generator 20, a delay element 21, a first pulse shaper 18b and a second pulse shaper 19b.

In each adder 5a, 5b and 5c each of its inputs E11, E12, E21 and E22 is provided with a synchronization circuit 15, 17, 14 or 16, i.e. each of these inputs E11, E12, E21 and E22 is connected within the adder to a data input of a synchronization circuit 15, 17, 14, 16, respectively. The synchronization circuits 14 to 17 serve to effect the time-delayed synchronization of the two pairs of input signals of the corresponding adder 5a, 5b and 5c. In each adder 5a, 5b and 5c each of the outputs of the synchronization circuits 14 and 15 is connected with an input of the first gate 18a and each of the outputs of the synchronization circuits 16 and 17 is connected to an input of the second gate 19a. The two gates 18a and 19a are preferably OR-gates and are used for the time-serial addition (i.e. time serial combination) of the output pulses of the two corresponding synchronization circuits 14 and 15 or 16 and 17. The output of the clock generator 20 is connected to an input of the delay element 21 which has 3 outputs. The first output is connected to a clock input of each of the synchronization circuits 14 and 16, the second output is connected to the clock input of each of the synchronization circuits 15 and 17 and its third output is connected to the control input of each of the pulse shapers 18b and 19b. The gate 18a and the pulse shaper 18b as well as the gate 19a and the pulse shaper 19b are each connected in series in the indicated sequence. Each of the outputs of the pulse shapers 18b and 19b constitutes an output of the adders 5a, 5b and 5c.

Figure 3:
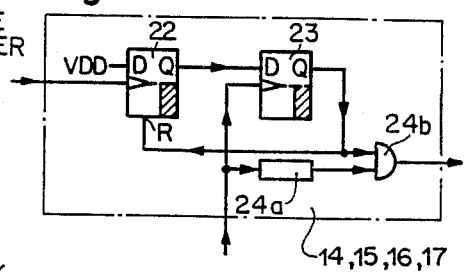
FIG. 3 shows a block diagram of a synchronization circuit.

All the synchronization circuits 14 to 17 are of identical structure, e.g. with a structure such as shown in FIG. 3. The synchronization circuits comprise a first D-flipflop 22, a second D-flipflop 23, a delay element 24a and an AND-gate 24b. The input of each of the synchronization circuits 14, 15, 16 and 17 is connected to the clock input of the first D-flipflop 22 while its output is formed by the output of the AND-gate 24b. The D-input of the first D-flipflop 22 is fed by a supply voltage VDD representing the logical value "1" while its Q-output is connected to the D-input of the second flipflop 23, the Q-output of which is in turn connected to the reset input R of the first D-flipflop 22 and to the first input of the AND-gate 24b. The clock input of each of the synchronization circuits 14 to 1 is connected to the clock input of the second D-flipflop 23 and via the delaying element 24a to a second input of the AND-gate 24b. A control delay between the clock input and the Q output of the flipflop 23 causes an interference pulse to be created with the following clock pulse at the output of the AND-gate 24b after the signal at the D-input of the flipflop 23 changes from the logical value "1" to the logical value "0+, the length in time of said interference pulse being precisely the same as the control delay. The delaying element 24a serves to suppress this interference pulse.

On the one hand the rectangular output pulses of the clock generator 20 (see FIG. 2) ideally reach a first output of the delay element 21 without time delay and on the other hand they reach a second output of the delay element 21 with a certain amount of time delay. This time delay is preferably equal to one half the pulse period. The synchronization arrangements 14 and 15 or 16 and 17 are then synchronized in a push-pull manner that their output pulses do not overlap. In that case the gates 18a and 19a may be purely OR-gates. They serve for the time-serial addition (i.e. combination into a single pulse sequence) of the output pulses of the synchronization configurations 14 and 15 or 16 and 17. The actual synchronization (see FIG. 3) takes place within the synchronization configurations 14 to 17 by means of the second D-flipflop 23 which synchronizes the output signal of the first D-flipflop 22 with the positive-running edge of the clock pulses occurring at the clock input of the synchronization configurations 14 to 17 by transmitting the above-mentioned output signal to its Q-output only at the moment of occurrence of the positive-running edge. The AND-gate 24b limits the length in time of the output pulses of the second D-flipflop 23 to that of the clock pulses. The first D-flipflop 22 is only an auxiliary control serving to limit the length in time of the input pulse of the second D-flipflop 23.

The pulse shapers 18b and 19b serve to extend their short input pulses so that these can again be synchronized by the synchronization control of the subsequent input circuit 1b or 1c. For it is possible, by adding up two input pulses, for three pulses to be transmitted in rapid succession to the input of a pulse shape 18b or 19b. These pulses must then be retransmitted with extended pulse width by the corresponding pulse shaper 18b or 19b, i.e. a pulse memory for up to three pulses is provided in each pulse shaper 18b and 19b. The median input and output frequencies of the pulse shapers 18b and 19b remain exactly equal in that case, i.e. the pulse count is not changed by the pulse shaping. The pulse width of the output pulses of the pulse shapers 18b and 19b is given by a control signal R which is transmitted from the third output of the delay element 21 to the control inputs of the pulse shapers 18b and 19b. The two pulse shapers 18b and 19b are of identical structure, e.g. the structure shown in FIG. 6.

Figure 4:
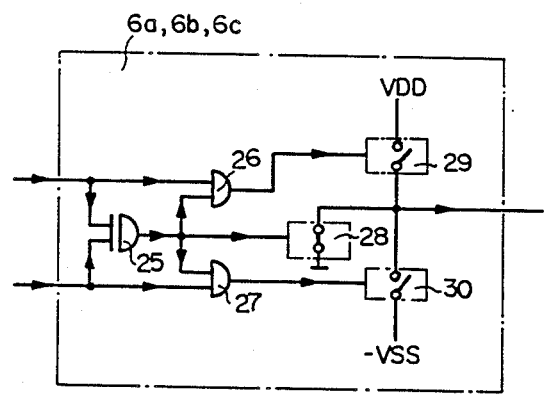
FIG. 4 shows a block diagram of a ternary encoder.

The ternary encoder 6a, 6b or 6c, shown in FIG. 4, comprises an exclusive-OR gate 25, a first AND-gate 26, a second AND gate 27, a first switch 28, a second switch 29 and a third switch 30. Within each ternary encoder 6a, 6b or 6c, a first input is connected to a first input of the exclusive-OR-gate 25 and to a first input of the AND-gate 26. A second input of each ternary encoder is connected to a second input of the exclusive-OR-gate 25 and to a first input of the second AND-gate 27. The output of the exclusive-OR-gate 25 is connected to a second input of the AND-gate 26 and a second input of the AND-gate 27 as well as with a control input of the first switch 28 which is provided with a contact which is openable. The outputs of the AND-gates 26 and 27 are connected with a control input of the switches 29 and 30. Each of the switches 29 and 30 is provided with a contact which is closable. The output of the ternary encoder 6a, 6b or 6c is connected via the first switch 28 to the ground, via the second switch 29 to a positive supply voltage VDD and via the third switch 30 to a negative supply voltage −VSS.

In the presence of a pulse at one of the two inputs of the ternary encoder 6a, 6b or 6c the corresponding AND-gate 26 or 27 is opened by the exclusive-OR-gate 25, the output signal of which has then a logical value "1". This causes the simultaneous opening of the switch 28. At the output of the AND-gate 26 or 27 a logical value "1" appears which activates the corresponding switch 29 or 30 so that either the positive supply voltage VDD is transmitted via switch 29 or the negative supply voltage −VSS is transmitted via switch 30 to the output of the ternary encoder 6a, 6b or 6c. If no pulse is present at either of its two inputs, i.e. if these are pulse gaps, the output of the exclusive-OR-gate 25 has a logical value "0", the two AND-gates 26 and 27 are closed and the switch 28 is closed so that 0 volts occurs at the output of the ternary encoder 6a, 6b or 6c.

Figure 5:
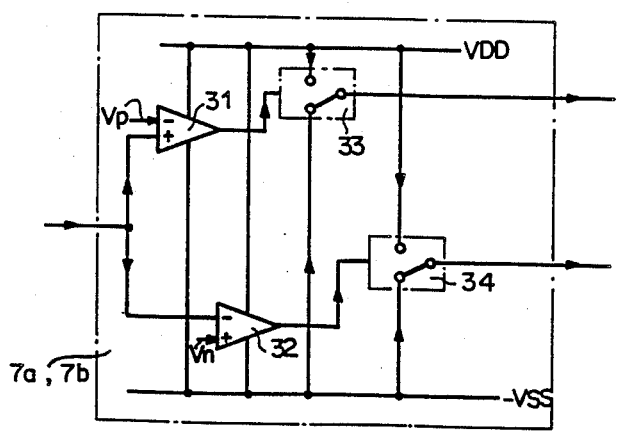
FIG. 5 shows a block diagram of a ternary decoder.

The ternary decoder 7a or 7b shown in FIG. 5 comprises a first comparator 31, a second comparator 31, a first change-over switch 33 and a second change-over switch 34. The single input of the ternary decoder 7a or 7b is connected to the non-inverting input of the first comparator 31 and to the inverting input of the second comparator 32, the outputs of which are each connected to a control input of the change-over switch 33 or 34. The inverting input of the first comparator 31 is fed by a reference voltage Vp and the non-inverting input of the second comparator by a second reference voltage Vn. A first output of the ternary decoder 7a or 7b is connected by means of the first change-over switch 33 and its second output by means of the second change-over switch 34 either to a positive supply voltage Vdd or to a negative supply voltage VSS.

VDD > Vp > 0 volt

−VSS < Vn < 0 volt

If a positive pulse with an amplitude that is greater than Vp appears at the input of the ternary decoder 7a or 7b a logical value "1" appears at the output of the first comparator 31 and activates the change-over switch 33 so that the supply voltage VDD occurs briefly, for the duration of the pulse, at the corresponding output of the ternary decoder 7a or 7b where the supply voltage −VSS normally is present. If on the other hand a negative pulse with an amplitude that is greater than the absolute value of Vn appears at the input of the ternary encoder 7a or 7b, then a logical value "1" occurs at the output of the second comparator 32 and activates the second change-over switch 34 so that this time the supply voltage VDD occurs briefly, for the duration of the pulse, at the other output of the ternary decoder 7a or 7b where the supply voltage −VSS also is normally present. VDD signifies in this case logical value "1" and −VSS signifies logical value "0".

Figure 6:
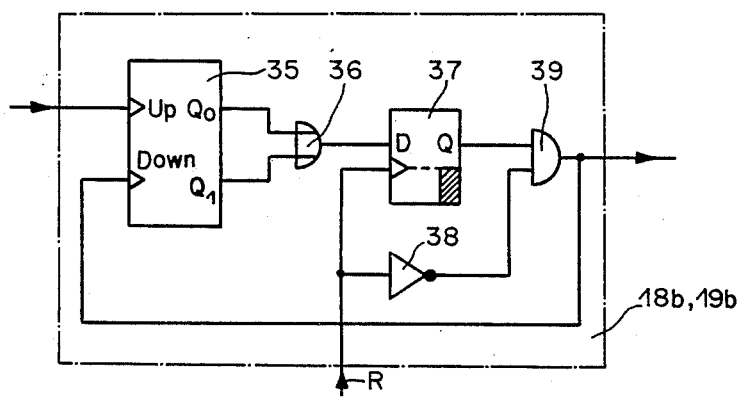
FIG. 6 shows a block diagram of a pulse shaper.

The pulse shapers 18b and 19b shown in FIG. 6 comprise a forwards/backwards counter 35, an AND-gate 36, a D-flipflop 37, an invertor 38 and an AND-gate 39. The input of the pulse shaper 18b, 19b is connected with the forward-counting clock input "Up" of the forwards/backwards counter 35 while the backward counting clock input "Down" is controlled from the output of the AND-gate 39. Each of the two outputs $Q_0$ and $Q_1$ of the forwards/backwards counter 35 is connected to an input of the OR-gate 36, the output of which is in turn connected to the D-input of the D-flipflop 37. The control input of the pulse shapers 18b and 19b at which the control signal R occurs is directly connected to the clock input of the D-flipflop 37 and via invertor 38 to the first input of the AND-gate 39. The Q-output of the D-flipflop 37 is connected to the second input of the AND-gate 39, the output of which constitutes the output of the pulse shapers 18b and 19b.

The content of the forwards/backwards counter 35 is increased by the value one with the positive edge of each input pulse of the pulse shapers 18b and 19b. The content of the forwards/backwards counter 35 is decreased by the value one with the positive edge of each output pulse of the pulse shapers 18b and 19b. As soon as the binary counting state is zero, a logical value "0" appears at the output of the OR-gate 36, i.e. a logical value "0" appears at the output Q of the D-flipflop 37 with the next clocking pulse of the control signal R. This causes the AND-gate 39 to be closed and no pulse is produced by the pulse shapers 18b or 19b. Since the two pulse shapers 18b and 19b have the same control signal R, a pulse can appear simultaneously at the output of each of them. By means of the exclusive-OR-gate 25 in the ternary encoder 6a, 6b or 6c (see FIG. 4) pulses appearing simultaneously are suppressed and are not transmitted, and this is no disadvantage since the sum of a positive and of a negative power output of equal value is always zero.

Finally, the above described embodiments of the invention are intended to be illustrative only. Numerous alternative embodiments may be devised by those skilled in the ar without departing from the spirit and scope of the following claims.

We claim:

1. A circuit arrangement for summing power outputs for use in a multi-phase electricity meter, said circuit arrangement comprising:

a plurality of inputs circuits arranged in a sequence, each of said input circuits comprising an input converter, a multiplier connected to said input converter, and a voltage-to-frequency converter connected to said multiplier, starting at least with the second input circuit in said sequence, each of said input circuits comprising an adder having a first input means connected to the voltage-to-frequency converter of the corresponding input circuit, a second input means connected to an output of the preceding input circuit in said sequence, and an output which forms an output of the corresponding input circuit.

wherein each voltage-to-frequency converter is provided with a first output for positive power and a second output for negative power, the first input means of each adder comprises first and second inputs, the second input means of each adder comprises first and second inputs, each adder has first and second outputs, one for positive power and one for negative power, said first and second outputs of each adder forming first and second outputs of the corresponding input circuit, said first and second outputs of each frequency converter being connected, starting at least with the second input circuit in said sequence, to the first and second inputs of the first input means of the corresponding adder, and said first and second inputs of the second input means of each adder being connected to a position power output and a negative power output of the preceding input circuit in said sequence.

2. The arrangement of claim 1 wherein said arrangement further comprises a ternary encoder connected to the outputs of at least one adder of an input circuit in said sequence and a ternary decoder connected to the outputs of the ternary encoder, the outputs of the ternary decoder being connected to the first and second inputs of the second input means of the adder in the next succeeding input circuit of said sequence.

3. The arrangement of one of claims 1 or 2 wherein, said first and second input means of each adder are provided with first and second synchronization means, respectively, for the time delayed synchronization of first and second pairs of input signals to said adder present at said first and second input means, respectively, said first and second synchronization means including gate means for the time serial combination of pulses comprising said first and second pairs of input signals, respectively.

* * * * *